United States Patent [19]

Kamaya

[11] Patent Number: 5,315,559
[45] Date of Patent: May 24, 1994

[54] ASYNCHRONOUS ACCESS TYPE SEMICONDUCTOR MEMORY DEVICE EQUIPPED WITH DATA LATCHING UNIT FOR PREVENTING OUTPUT DATA INFORMATION FROM NOISES

[75] Inventor: Michinori Kamaya, Kanagawa, Japan

[73] Assignee: NEC Corporation, Tokyo, Japan

[21] Appl. No.: 775,422

[22] Filed: Oct. 15, 1991

[30] Foreign Application Priority Data

Oct. 15, 1990 [JP] Japan .................... 2-276058

[51] Int. Cl.$^5$ .................... G11C 7/00; G11C 11/34
[52] U.S. Cl. .................... 365/233.5; 365/230.08; 365/230.01
[58] Field of Search ............... 365/203, 230.08, 233.5, 365/233.4, 230.01

[56] References Cited

U.S. PATENT DOCUMENTS

| | | | |
|---|---|---|---|
| 4,701,889 | 10/1987 | Ando ............................ | 365/203 |
| 4,717,835 | 1/1988 | Takeuchi .................... | 365/230.08 |
| 4,849,938 | 7/1989 | Fuowtani et al. ........... | 371/10 |
| 4,922,461 | 5/1990 | Hayakawa et al. ......... | 365/230.08 |
| 5,047,984 | 9/1991 | Monden ...................... | 365/203 |

FOREIGN PATENT DOCUMENTS

| | | |
|---|---|---|
| 56-165983 | 12/1981 | Japan . |
| 59-125180 | 1/1986 | Japan . |
| 2070372 | 9/1981 | United Kingdom . |

*Primary Examiner*—Eugene R. LaRoche
*Assistant Examiner*—Viet Q. Nguyen
*Attorney, Agent, or Firm*—Sughrue, Mion, Zinn, Macpeak & Seas

[57] ABSTRACT

An asynchronous access type semiconductor memory device allows a memory cell array to supply a new data bit to an output data buffer unit for producing an output data signal indicative of the new data bit, and a data latching unit decides whether or not the new data bit is transferred to the output data buffer unit in view of lapse of time from address change to an address location assigned to a memory cell storing the new data bit so that the output data buffer unit is prevented from unexpected data bit read out upon false address change.

9 Claims, 3 Drawing Sheets

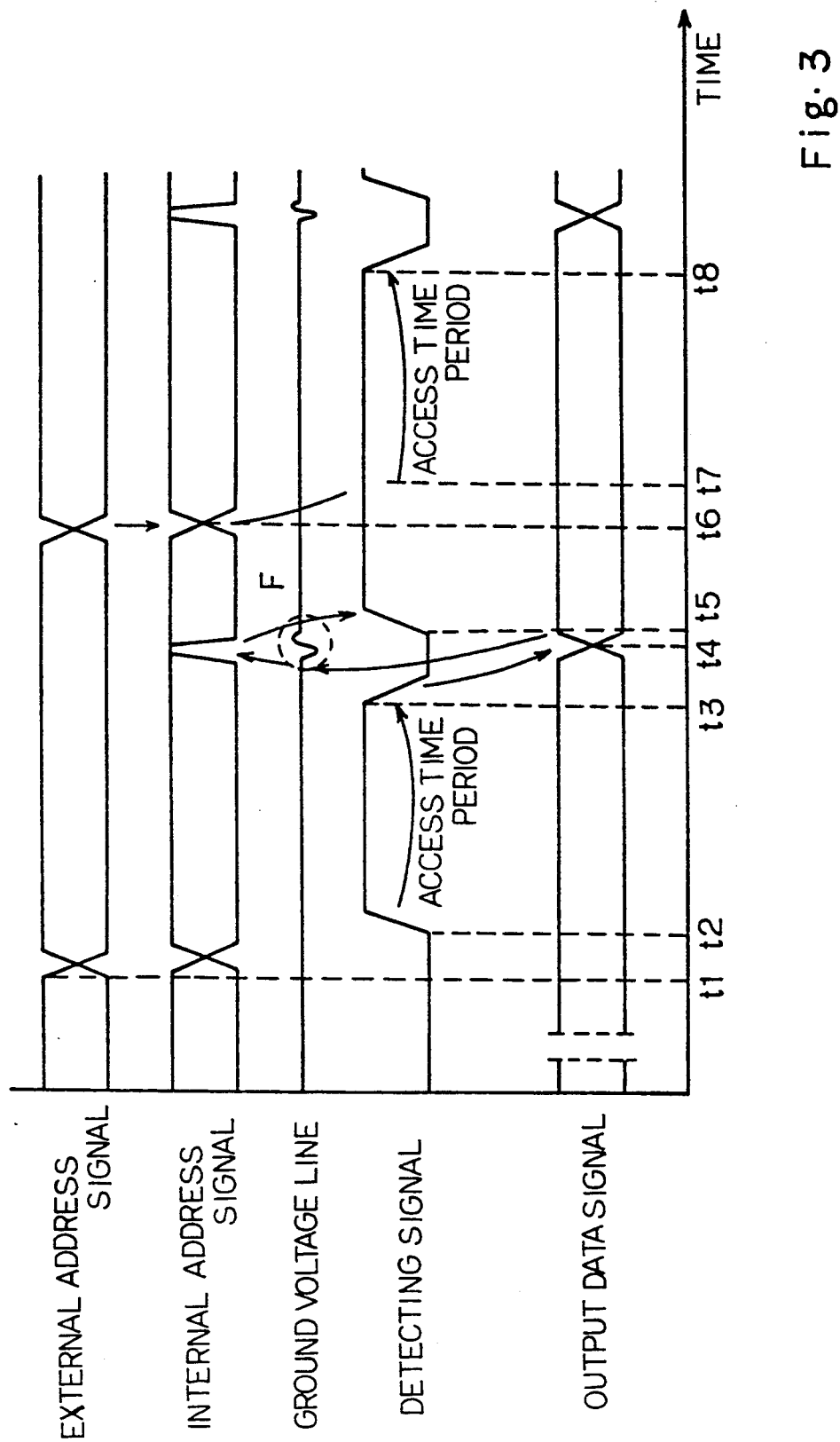

ASYNCHRONOUS ACCESS TYPE SEMICONDUCTOR MEMORY DEVICE EQUIPPED WITH DATA LATCHING UNIT FOR PREVENTING OUTPUT DATA INFORMATION FROM NOISES

FIELD OF THE INVENTION

This invention relates to an asynchronous access type semiconductor memory device and, more particularly, to a data output facility incorporated in the asynchronous access type semiconductor memory device.

DESCRIPTION OF THE RELATED ART

The asynchronous access type semiconductor memory devices are broken down into a static random access memory, an electrically programmable read only memory, an electrically erasable and programmable read only memory, and a data bit is read out from either memory cell under an asynchronous control without any sequence of internal timing signals. Namely, if an external address signal is indicative of a memory cell of the asynchronous access type semiconductor memory device, a data bit is read out from the memory cell, and is relayed from circuit to circuit provided in an output data path. Finally, when the data bit reaches the output data buffer unit, the output data buffer unit immediately drives the output data pin without any output enable signal, and the output data signal indicative of the data bit is delivered from the asynchronous semiconductor memory device. Since a large amount of capacitance is coupled to the output data pin, the output data buffer unit is implemented by large-sized component transistors, and, accordingly, has large current driving capability. For this reason, current rapidly flows through the output data buffer unit into the ground voltage line due to the capacitance coupled with the output data pin, and the voltage level on the ground line tends to fluctuates. When the ground voltage line fluctuate, the fluctuation affects the voltage level at the input node of the address buffer unit, and the input address buffer unit is liable to misinterpret that the address signal applied thereto is changed. This results in that the address buffer unit changes the internal address signal, and a new data bit is read out from another memory cell. The new data bit is relayed to the output data buffer unit, and the output data buffer unit mistakenly supplies the new data bit to a destination instead of the previous data bit. The fluctuation on the ground voltage line is increased with the parallel data bits of the output data signal, and the undesirable change is one of the serious problems of the asynchronous access type semiconductor device.

In order to cope with the undesirable change, two approaches have been proposed. The first approach is disclosed in Japanese Utility Model Application No. 62-191831, and proposes to compensates the fluctuation in voltage level at the input node of the address buffer unit with an accumulator implemented by a resister and a capacitor. If the accumulator has a large time constant, the accumulator compensates for the undesirable fluctuation, however, the accumulator retards the input address signal too. On the other hand, a small time constant prevents the input address signal from time delay; however, the accumulator with a small time constant is less effective against the undesirable fluctuation. Thus, there is a trade-off in the first approach.

The second approach is disclosed in Japanese Patent Application No. 63-305214, and proposes to couple an accumulator implemented by a resister and a capacitor with the output data unit. The second approach increases the capacitive load coupled with the output data buffer unit, and the access time is prolonged. The second approach also encounters the trade-off, and the prolonged access time is hardly acceptable for a high-speed semiconductor memory device.

Thus, both first and second approaches introduce time delay, and a solution without sacrifice of access time is required.

SUMMARY OF THE INVENTION

It is therefore an important object of the present invention to provide an asynchronous access type semiconductor memory device which is free from unintentional read-out of data bits due to fluctuation of a ground voltage line without sacrificing high-speed operation.

To accomplish the object, the present invention proposes to discriminate a read-out data bit regularly accessed in view of expected time period.

In accordance with the present invention, there is provided an asynchronous access type semiconductor memory device comprising a) a memory cell array having a plurality of memory cells respectively assigned address locations and storing data bits, respectively, b) an address buffer unit for receiving an external address signal indicative of one of the address locations, and operative to produce an internal address signal on the basis of the external address signal, c) a detecting unit measuring a predetermined time period from address transition to the aforesaid one of the address locations, and changing a detecting signal from a first level to a second level when the predetermined time period is expired, the detecting unit recovering the detecting signal to the first level when the internal address signal is changed, d) an addressing means responsive to the internal address signal, and allowing at least one of the data bits to be read out from one of the plurality of memory cells assigned the aforesaid one of the address locations, e) a data latching unit transferring the aforesaid at least one of the data bits to an output data buffer unit while the detecting signal is in the second level, the data latching unit being responsive to the detecting signal of the first level for temporally storing the aforesaid at least one of the data bits.

BRIEF DESCRIPTION OF THE DRAWINGS

The features and advantages of the asynchronous access type semiconductor memory device according to the present invention will be more clearly understood from the following description taken in conjunction with the accompanying drawings in which:

FIG. 3 is a timing chart showing a sequential access to data bits memorized in the asynchronous access type semiconductor memory device shown in FIG. 1.

DESCRIPTION OF THE PREFERRED EMBODIMENT

Figure 1:
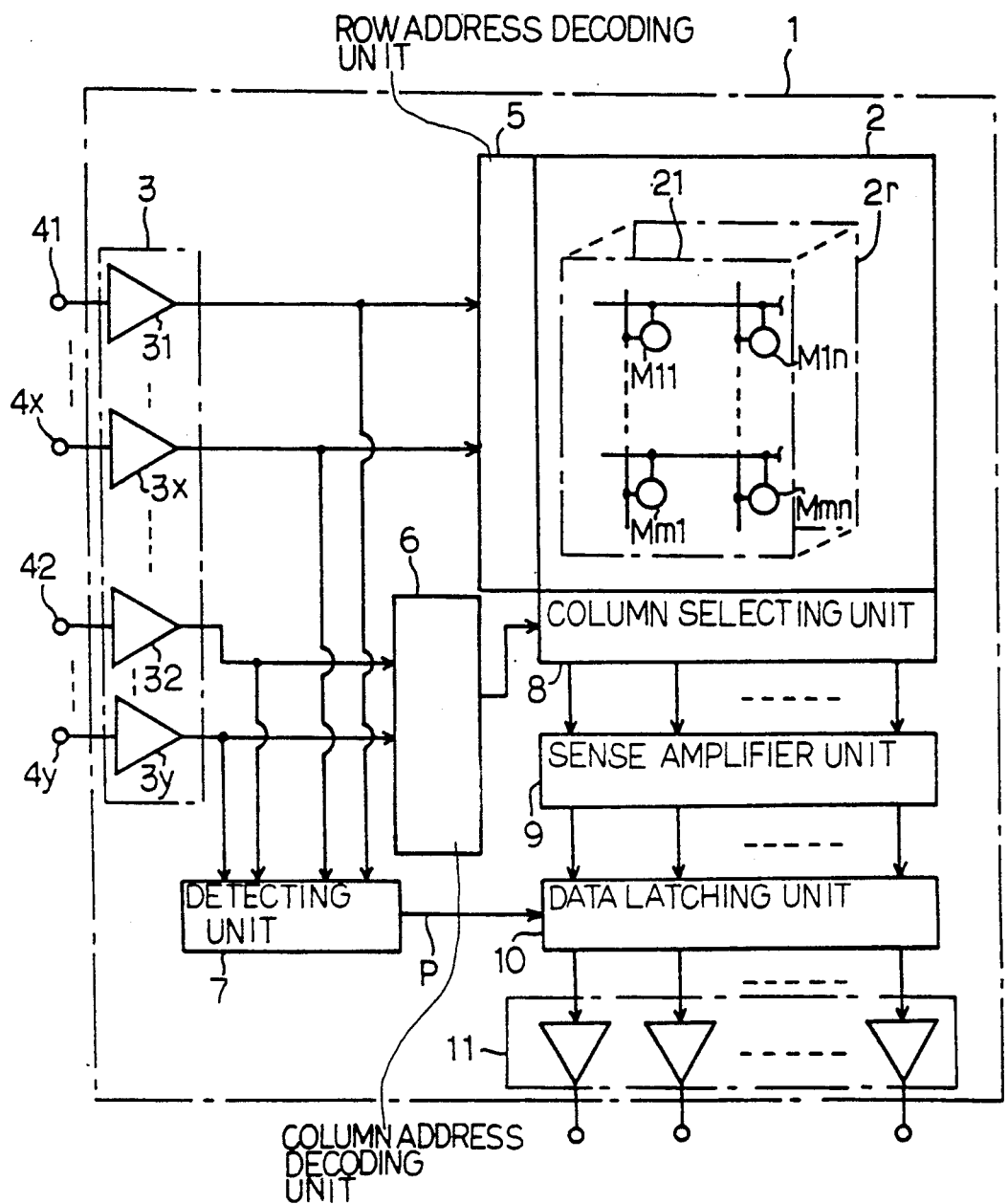
FIG. 1 is a block diagram showing the arrangement of an asynchronous access type semiconductor memory device according to the present invention.

Referring first to FIG. 1 of the drawings, an asynchronous access type semiconductor memory device embodying the present invention is fabricated on a single semiconductor chip 1, and comprises a memory cell array 2. The memory cell array 2 has a plurality of memory cell blocks 2l to 2r, and each of the memory cell blocks 2l to 2r is implemented by a plurality of memory cells Mll, Mln, Mml and Mmn arranged in rows and columns. The memory cells Mll to Mmn are of a static random access memory, a mask-ROM, an electrically programmable read only memory or an electrically erasable and programmable read only memory, and data bits are stored in the memory cells Mll to Mmn, respectively. Address locations are assigned to the memory cells of every memory cell block, and each address location is shared between the memory cell blocks 2l to 2r. Namely, if the memory cells of the respective memory cell blocks 2l to 2r are disposed at corresponding locations to one another, the memory cells are assigned an address location.

The asynchronous access type semiconductor memory device further comprises an address buffer unit 3 implemented by a plurality of address buffer circuits 3l to 3x and 32 to 3y, and input address terminals 4l to 4x and 42 to 4y are coupled in parallel with the address buffer circuits 3l to 3x and 32 to 3y. An external address signal has row address bits respectively supplied to the input address terminals 4l to 4x and column address bits respectively supplied to the address terminals 42 to 4y, and the external address signal is indicative of an address location assigned to the memory cells respectively selected from the memory blocks 2l to 2r. The address buffer unit 3 temporarily stores the external address signal, and produces a multi-bit internal address signal indicative of the address location. The multi-bit internal address signal is distributed to a row address decoding unit 5 and a column address decoding unit 6, and is further supplied to a detecting unit 7. The row address decoding unit 5 allows a row of the memory cells Mll to Mmn of each memory cell block to supply data bits to a column selecting unit 8, and the column selecting unit 8 is responsive to a decoded signal of the column address bits for transferring data bits read out from the memory cells assigned the address location indicated by the external address signal. Thus, the row address decoding unit 5, the column address decoding unit 6 and the column selecting unit 8 allow the memory cells assigned the address location to read out data bits to be accessed, and as a whole constitute an addressing means.

The column selecting unit 8 is coupled with a sense amplifier unit 9, and the sense amplifier unit 9 quickly discriminates the logic level of each data bit. The sense amplifier unit 9 is coupled with a data latching unit 10, and the data latching unit 10 temporarily stores the data bits in response to the leading edge of a detecting signal P from a low level to a high level. However, the data latching unit 10 becomes transparent to the data bits supplied from the sense amplifier unit 9 while the detecting signal P is in the low level. In this instance, the high and low levels respectively mean first and second level, and corresponds to logic "1" level and logic "0" level, respectively.

Figure 2:
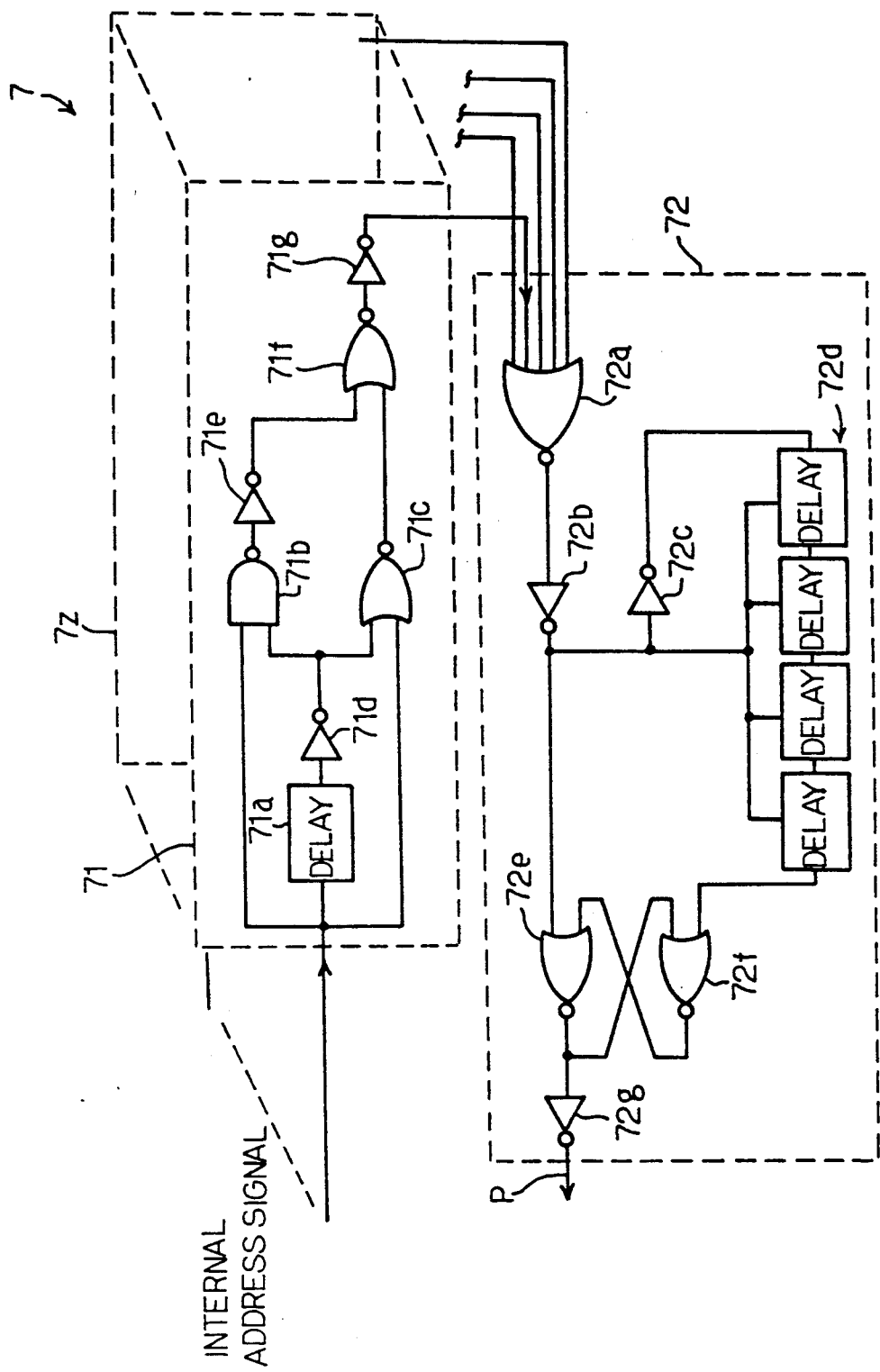
FIG. 2 is a circuit diagram showing the arrangement of a detecting unit incorporated in the asynchronous access type semiconductor memory device shown in FIG. 1.

Turning to FIG. 2 of the drawings, the arrangement of the detecting unit 7 is illustrated in detail. The detecting unit 7 largely comprises a plurality of transition detecting circuits 7l to 7z respectively assigned the address bits of the internal address signal, and a timer circuit 72. The transition detecting circuits 7l to 7z are similar in arrangement to one another, and only the transition detecting circuit 7l is described in detail. The address bit of the internal address signal is supplied in parallel to a delay circuit 71a, a NAND gate 71b and a NOR gate 71c, and the delay circuit 71a supplies a delayed address bit through an inverting circuit 71d to both of the NAND and NOR gates 71b and 71c. The NAND gate 71b is coupled through an inverting circuit 71e with an input node of a NOR gate 71f, and the NOR gate 71c is directly coupled with the other input node of the NOR gate 71f. The NOR gate 71f is coupled through an inverting circuit 71g, and the inverting circuit 71g is coupled with a NOR gate 72a of the timer circuit 72. The NOR gate 72a has the input nodes equal to the transition detecting circuits 7l to 7z, and all of the inverting circuits 71g respectively incorporated in the transition detecting circuits 7l to 7z are coupled with the input nodes of the NOR gate 72a, respectively.

Assuming now that the internal address signal changes the logic level of the address bit supplied to the transition detecting circuit 7l, the transition is detected by the circuit 7l, and is reported to the timer circuit 72. First, let us consider address transition from logic "1" to logic "0". While the address bit is in logic "1" level, the delay circuit 71a produces logic "1", and the inverting circuit 71d yields logic "0". The NAND gate 71b produces logic "1", and the NOR gate yields logic "0". Since the output of the NAND gate 71b is inverted, both input nodes of the NOR gate 71f are logic "0" level, and the inverting circuit 71g supplies logic "0" to the timer circuit 72. The output of logic "0" of the inverting circuit 71d has enabled the NOR gate 71c. However, the NAND gate 71b remains inactive, and continues to produce logic "1" level regardless of the transition of the address bit. Upon transition of the address bit, the NOR gate 71c yields logic "1", and logic "1" is directly supplied to the NOR gate 71f. Since the output of logic "1" level of the NAND gate 71b is inverted to logic "0" level by the inverting circuit 71e, logic "1" and logic "0" are supplied to the NOR gate 71f, and the NOR gate 71f changes the output from logic "1" to logic "0", and, accordingly, the inverting circuit 71g produces logic "1". When the first predetermined time period is expired, the delay circuit 71a changes the output from logic "1" to logic "0", and, accordingly, the inverting circuit 71d changes the output from logic "0" to logic "1". Then, the NOR gate 71c is disabled so as to change the output from logic "1" to logic "0", and the NAND gate 71b is enabled to produce logic "1"which is inverted to logic "0". Both inputs of the NOR gate 71f are logic "0", and the NOR gate 71f yields logic "1", and the inverting circuit 71g changes the output from logic "1" to logic "0". Thus, while no transition takes place, the transition detecting circuit 7l keeps the output in logic "0", and changes the output to logic "1" upon transition of the address bit. The transition detecting circuit 7l keeps the output in logic "1" level for the first predetermined time period, and recovers the output from logic "1" to logic "0" when the first predetermined time period is expired.

If the address bit is changed from logic "0" to logic "1", the NAND gate 71b changes the output from logic "1" to logic "0", and the inverting circuit supplies logic "1" to the NOR gate 71f. The NOR gate 71f yields logic "0" level, and the inverting circuit 71g changes the output from logic "0" to logic "1". The inverting circuit 71g continues to supply logic "1" for the first predetermined time period. When the first predetermined time period is expired, the delay circuit 71a changes the output from logic "0" to logic "1", and the inverting circuit 71d changes the output from logic "1" to logic "0". The NAND gate 71b enters the inactive state, and changes the output from logic "0" to logic "1". The output of the NAND gate 71b is inverted to logic "0" which is supplied to the NOR gate 71f. On the other hand, when the inverting circuit 71d changes the output to logic "0", the NOR gate 71c is enabled, however, the NOR gate 71c keeps the output in logic "0". Logic "0"is supplied to both input nodes of the NOR gate 71f, and the NOR gate 71f recovers the output to logic "1". Accordingly, the inverting circuit 71g recovers the output to logic "0". Thus, the output of the inverting circuit 71g is kept in logic "1" for the first predetermined time period.

The timer circuit 72 further comprises a series combination of inverting circuits 72b and 72c, a series combination of delay circuits 72d having an input node and a reset node respectively coupled with the inverting circuits 72c and 72b, a flip flop circuit implemented by two NOR gates 72e and 72f, and an inverting circuit 72g. The series combination of delay circuits 72d introduces a second predetermined time delay into propagation of the output of the inverting circuit 72c. In this instance, the second predetermined time period is as long as an access time period, and the access time period is defined as lapse of time from an address transition to delivery of data bits at the output nodes of the sense amplifier unit 9.

While any address transition does not take place, the NOR gate 72a is supplied with the outputs of logic "0" from the transition detecting circuits 7l to 7z, and produces logic "1" level. The inverting circuit 72b supplies logic "0" to the NOR gate 72e, and the inverting circuit 72c applies logic "1" through the series combination of delay circuits 72d to the NOR gate 72e. Then, the NOR gate 72e supplies logic "1" to the inverting circuit 72g, and the inverting circuit 72g keeps the output in logic "0" level.

Assuming now that an external device accesses data bits memorized in the memory cell array 2, the external device changes the external address signal at time t1 as shown in FIG. 3. Accordingly, the address buffer unit 3 changes the multi-bit internal address signal, and the address transition is detected by the transition detecting circuits 7l to 7z. The transition detecting circuits 7l to 7z lift up at least one output signal, and keep high for the first predetermined time period. The NOR gate 72a changes the output signal from logic "1" level to logic "0" level, and, accordingly, the inverting circuit 72b changes the output from logic "0" level to logic "1" level. With the output signal of logic "1" level fed from the inverting circuit 72b, the NOR gate 72e of the flip flop circuit changes the output from logic "1" level to logic "0" level. The inverting circuit 72g lifts up the output or the detecting signal P to logic "1" level at time t2. While the output signal of the inverting circuit 72b is kept in logic "1" level, the delay circuits 72d remain reset state. When the output of the inverting circuit 72b is recovered to logic "0" level, the inverting circuit 72c changes the output from logic "0" to logic "1", and the series combination of delay circuits 72d starts on measuring the second predetermined time period. If the second predetermined time period is expired at time t3, the series combination of delay circuits 72d causes the NOR gate 72e of the flip flop to change the output from logic "0" level to logic "1" level, and the inverting circuit 72g changes the detecting signal P to logic "0" level. Since the second predetermined time period is approximately equal to the access time period, the sense amplifier unit 9 has supplied the data bits to the data latching unit 10 at time t3. With the detecting signal P of logic "0" level, the data latching unit 10 becomes transparent to the data bits, and the data bits are transferred to the output data buffer unit 11. Therefore, the output data signal is changed at time t4, and are indicative of the data bits to be accessed.

The change of the output data bits results in fluctuation F on the ground voltage line, and the address buffer unit 3 is assumed to change the multi-bit internal address signal due to the fluctuation F on the ground voltage line The false address change is also detected by the transition detecting circuits 7l to 7z, and the outputs of the transition detecting circuits 7l to 7z cause the NOR gate 72a to change the output thereof to logic "0" level. The inverting circuit 72b accordingly changes the output thereof to logic "1" level, and keeps it in logic "1" level for the first predetermined time period. The NOR gate 72e of the flip flop circuit changes the output thereof to logic "0" level, and, according, the inverting circuit 72g changes the detecting signal P to logic "1" level at time t5. The data bits to be correctly accessed are latched by the latching unit 10 at time t5 in synchronism with the leading edge of the detecting signal P, and are continuously supplied to the output data buffer unit 11. While the detecting signal P remains in logic "1" level, the data latching unit 10 never transfers any data bits from the sense amplifier unit 9 to the output data unit 11, and, for this reason, false data bits never reach the output data buffer unit 11.

Before the second predetermined time period is expired, the external address signal is changed at time t6, and the inverting circuit 72b changes the output thereof to logic "1" again. However, the output of the inverting circuit 72b only resets the delay circuits 72d, and no alternation takes place in the output of the NOR gate 72e. If the output of the inverting circuit 72b is recovered to logic "0" level at time t7, the inverting circuit 72c allows the series combination of delay circuits 72d to restart. For this reason, the second predetermined time period is expired at time t8, and the detecting signal P allows the data latching unit 10 to be transparent upon reaching new data bits.

As will be understood from the foregoing description, the asynchronous access type semiconductor memory device according to the present invention is free from undesirable fluctuation, because the data latching unit blocks the output data buffer unit from false data bits. Any accumulator is not coupled with the address buffer unit and the output data buffer unit, and, for this reason, no substantial time delay takes place from the address transition to the data output.

Although particular embodiments of the present invention have been shown and described, it will be obvious to those skilled in the art that various changes and modifications may be made without departing from the spirit and scope of the present invention.

What is claimed is:

1. An asynchronous access type semiconductor memory device comprising:

a) a memory cell array having a plurality of memory cells respectively assigned address locations and storing data bits, respectively, b) an address buffer unit responsive to an external address signal indicative of an address transition from one of said address locations to another of said address locations, and operative to produce an internal address signal indicative of said another of said address locations on the basis of said external address signal, c) a detecting unit measuring a predetermined time period from said address transition to said another of said address locations, and changing a detecting signal from a first level to a second level when said predetermined time period is expired, said detecting unit recovering said detecting signal to said first level when said internal address signal is changed to indicate said another of said address locations, d) an addressing means responsive to said internal address signal, and allowing at least one of said data bits and another of said data bits to be sequentially read out from one of said plurality of memory cells assigned said one of said address locations and another of said plurality of memory cells assigned said another of said address locations, and e) a data latching unit transferring said at least one of said data bits to an output data buffer unit while said detecting signal is in said second level, said data latching unit being responsive to said detecting signal of said first level for temporarily storing said at least one of said data bits.

2. An asynchronous access type semiconductor memory device as set forth in claim 1, in which said detecting unit comprises a plurality of transition detecting circuits respectively supplied with component address bits of said internal address signal for producing output signals indicative of occurrence of an address change of said internal address signal, and a timer unit responsive to said output signals for changing said detecting signal from said second level to said first level, and measuring said predetermined time period for changing said detecting signal from said first level to said second level.

3. An asynchronous access type semiconductor memory device as set forth in claim 2, in which each of said transition detecting circuits comprises a parallel combination of a first delay circuit, a first NOR gate and a NAND gate supplied with one of said component address bits of said internal address signal, a first inverting circuit having an input node coupled with the output node of said first delay circuit and an output node coupled with said NAND gate and with said first NOR gate, a second inverting circuit having an input node coupled with the output node of said NAND gate, a second NOR gate having input nodes coupled with the output node of said first NOR gate and with the output node of said second inverting circuit, and a third inverting circuit having an input node coupled with the output node of said second NOR gate and an output node where one of said output signals of said transition detecting circuits takes place.

4. An asynchronous access type semiconductor memory device as set forth in claim 3, in which said timer circuit comprises a third NOR gate having input nodes supplied with said output signals, respectively, a series combination of fourth and fifth inverting circuits coupled with the output node of said third NOR gate, a series combination of second delay circuits having an input node coupled with the output node of said fifth inverting circuit and an reset node coupled with the output node of said fourth inverting circuit, a flip flop circuit having input node coupled with the output node of said fourth inverting circuit and with the output node of said series combination of second delay circuits, and a sixth inverting circuit having an input node coupled with the output node of said flip flop circuit and an output node where said detecting signal is produced.

5. An asynchronous access type semiconductor memory device as set forth in claim 4, in which said flip flop circuit comprises a fourth NOR gate having a first input node coupled with the output node of said fourth inverting circuit, and a fifth NOR gate having a first input node coupled with the output node of said series combination of second delay circuits, said fourth and fifth NOR gates having respective second input nodes respectively coupled with the output nodes of said fifth and fourth NOR gates.

6. An asynchronous access type semiconductor memory device as set forth in claim 5, in which said memory cell array is implemented by static type random access memory cells.

7. An asynchronous access type semiconductor memory device as set forth in claim 5, in which said memory cell array is implemented by mask-ROM cells.

8. An asynchronous access type semiconductor memory device as set forth in claim 5, in which said memory cell array is implemented by electrically programmable read only memory cells.

9. An asynchronous access type semiconductor memory device as set forth in claim 5, in which said memory cell array is implemented by electrically erasable and programmable read only memory cells.

* * * * *